United States Patent [19]

Arzubi et al.

[11] 4,112,512
[45] Sep. 5, 1978

[54] SEMICONDUCTOR MEMORY READ/WRITE ACCESS CIRCUIT AND METHOD

[75] Inventors: Luis Maria Arzubi, Colchester, Vt.; Joerg Gschwendtner, Esslingen; Robert Schnadt, Boeblingen, both of Germany

[73] Assignee: International Business Machines Corporation, Armonk, N.Y.

[21] Appl. No.: 863,566

[22] Filed: Dec. 22, 1977

[30] Foreign Application Priority Data

Mar. 23, 1977 [DE] Fed. Rep. of Germany ....... 2712735

[51] Int. Cl.² ........................................... G11C 11/40
[52] U.S. Cl. .................................. 365/203; 307/238; 365/189
[58] Field of Search ....................... 307/235, 238, 279; 365/203, 189, 222

[56] References Cited

U.S. PATENT DOCUMENTS

| | | | |
|---|---|---|---|
| 3,676,704 | 7/1972 | Donofrio | 307/235 |
| 3,771,147 | 11/1973 | Boll et al. | 340/173 R |
| 3,806,898 | 4/1974 | Askin | 340/173 DR |

Primary Examiner—Terrell W. Fears
Attorney, Agent, or Firm—Howard J. Walter, Jr.

[57] ABSTRACT

A high performance semiconductor memory read/write data access circuit including a sense amplifier directly coupled to a pair of bit lines is provided with a pair of bit switching devices to enable data communication external to the memory. Control potentials and timing of switching signals are provided in such a manner that only one of the bit switches becomes conductive during reading and writing access to the memory.

8 Claims, 5 Drawing Figures

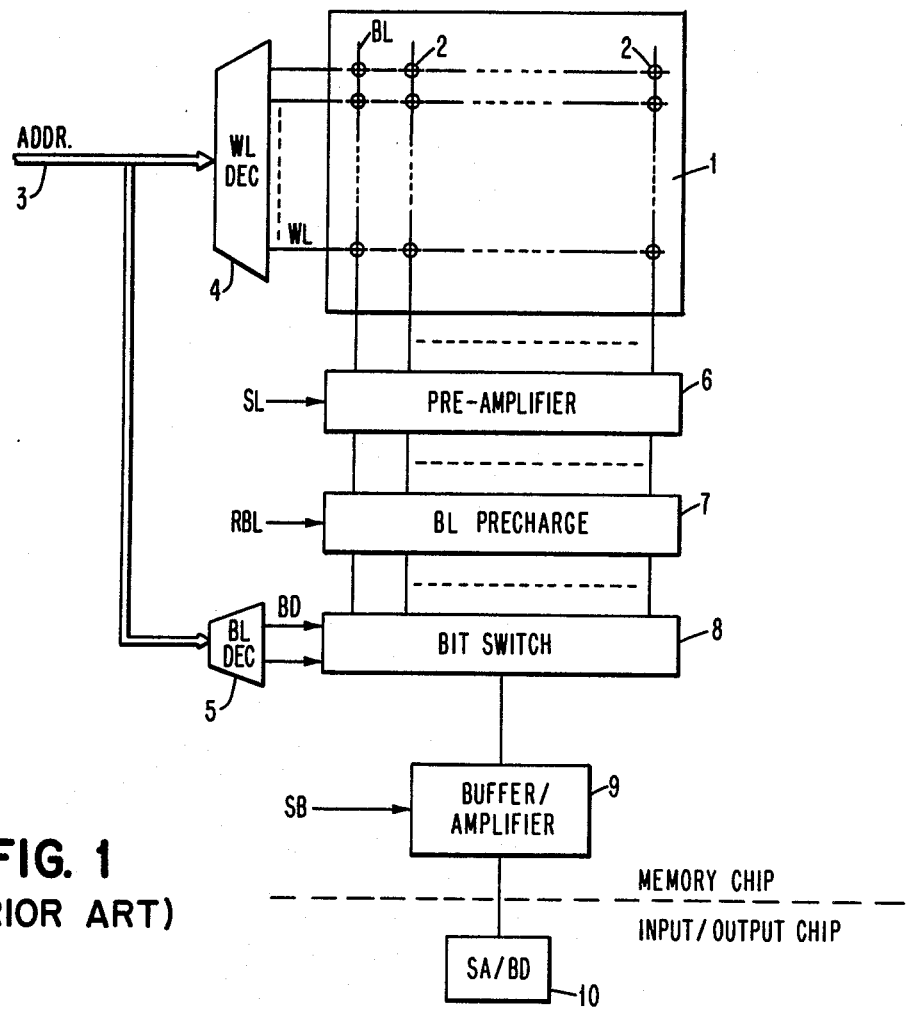
FIG. 1
(PRIOR ART)
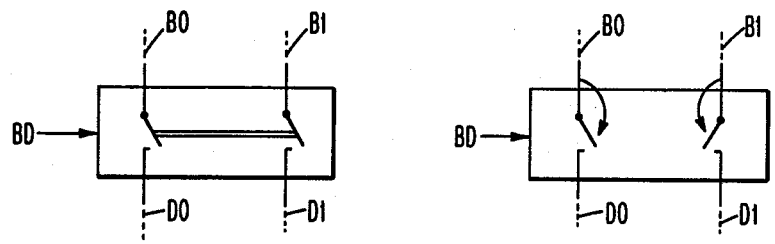
FIG. 4A
(PRIOR ART)
FIG. 4B

SEMICONDUCTOR MEMORY READ/WRITE ACCESS CIRCUIT AND METHOD

BACKGROUND OF THE INVENTION

1. Field of the Invention

The invention relates to a circuit arrangement for the read and/or write access to storage cells of a semiconductor memory.

2. Description of the Prior Art

In the field of electronic data processing systems there has, in recent years, been an almost soaring development towards systems of increasing performance. An important contribution has been the rapid development of the integrated circuit technology. In that technology particularly effective memories could be made which are required in all modern computer systems for the storage of data, programs, intermediate results, etc. It is particularly in this field that the integrated semiconductor memories are increasingly used in view of their unique flexibility and adaptability with regard to memory size, organization, speed, etc. to the respective conditions.

A general aim for such a memory system is that it should be as low-priced, quick, and reliable as possible. For the individual memory components, the memory chips, there result among other things the following main demands. A maximum of storage cells should be provided on a chip. The power dissipation per chip should be as low as possible. Reading and writing of the stored information should be realizable as quickly as possible. However, it is known that these demands are partly or fully contradictory so that a memory chip design will always aim at finding a relative optimum for a specific application with given technological conditions.

Particularly advantageous from the packing density and power dissipation points of view are dynamic semiconductor storge concepts. There, the information is stored in the form of a capacitive charge condition. Compared with static storage cells, dynamic storage cells can be made with less switching elements. Known dynamic storage cells include the so-called one-device cells, two-device cells, etc. which are at present mostly made in MOS technology. A known two-FET storage cell is described in the publication in the *IBM Technical Disclosure Bulletin*, Vol. 18, No. 3, August 1975, pp. 786/787. It is, however, known that dynamic storage cells can also be made in bipolar technology.

However, the development of storage cells which continuously decrease in size, for packing reasons, involves the difficulty of reliably evaluating the extremely small storage signals of a storage cell which are coupled to the access lines. In the course of obtaining storage readout of maximum sensitivity, the effort and complexity involved in designing sensing circuits increases. Each write/read access, to give an example, demands a precisely fixed succession of several control signals having very close tolerances with respect to time. Depending on whether a read or a write access is made different control signal sequences have to be additionally provided. This has, however, the consequence that the performance of the resulting storage arrangement as a whole increasingly depends on the peripheral support circuits of the storage cell array normally provided on the memory semiconductor chip, i.e. particularly on the access circuits.

Other known prior art includes U.S. Pat. No. 3,806,898 to Askin and assigned to the assignee of the instant invention. Askin describes a dynamic single FET/capacitor memory cell array including an isolation device coupled between an array column or data line and a column decoder. The gate of the isolation device is maintained at a constant bias at an intermediate potential VL of approximately one FET threshold voltage drop above ground potential. The data lines are precharged to VL prior to the accessing of data and the setting of a dynamic latch. As described, the memory system includes two timing response disadvantages. First, since the data line precharge potential is low, speed and sensitivity of the sense latch is not optimized. Second, since the bias on the gate of the isolation device is also low, no current can be coupled through the column decoders until the sense latch is substantially fully set. This last limitation also compromises the speed of sensing data at the memory chip output pads.

U.S. Pat. No. 3,771,147 to Boll et al is also of interest as it relates to a dynamic single FET/capacitor memory cell array including dynamic sense latches in which column or data line switches are prebiased to be responsive to a differential sense signal developed by the sense latch. In this reference, all data line switches have their gate electrodes biased at one threshold voltage drop below the precharge potential, corresponding to a high FET logic level, provided on the data lines. When address signals are developed on the memory chip all but one of the column select lines are discharged to a low level logic potential. In order to prevent the data line switches from being conductive prior to the setting of the sense latch, the data input/output terminals coupled to the data line switches are biased at the same potential as the data lines. Although such a system avoids the problem presented by Askin of low level bit line precharging, it demands considerably more power dissipation as the column select lines must all be initially precharged. In addition, due to the relatively high precharge potential on the column select lines, requiring a high level of precharge on the input/output terminals, causes difficulty in rendering the circuit compatible with known bipolar current sensing circuits. Also since the precharge potential of the column select lines is at a relatively high level, being only one threshold voltage drop below the FET high level logic signal, the column switches begin to pass current to the sense latch at an early point in time thus possibly slowing down the response of the latch due to additional capacitive coupling added by rendering the column switch conductive when the column line reaches one threshold below the column select line precharge potential.

SUMMARY OF THE INVENTION

It is an object of the invention to provide an improved access system for storage arrangements of the above specified type with the aim of reducing the access time and furthermore to manage the operation with control signals that are less critical with respect to time. For solving this problem the invention provides, an array of two-device storage cells each coupled to a pair of data lines. The data lines are connected to the inputs of a differential sense latch and to a pair of column select line responsive bit switches. A selective bit switch is enabled at the same time that a row of storage cells are accessed by a row select or word line potential pulse is applied to the memory array. The data lines are precharged to a high level while the data input/output lines, to which the bit switches enable a differential current to be applied, are precharged in accordance with the bipolar voltage levels utilized by an off chip sense amplifier-buffer circuit. The select potential applied to the gate electrode of the selected pair of bit switches is limited to about one-half that on the precharged data lines and not more than one threshold voltage drop above the biasing potential on the input-/output lines.

BRIEF DESCRIPTION OF THE DRAWINGS

FIG. 1 is a schematic block diagram the basic organization of a storage chip illustrating the relationship of the various circuit elements as known in the prior art.

FIGS. 4a and 4b are generalized representations for demonstrating the operation of the bit line switches as disclosed by the invention compared with prior art.

FIG. 1 shows in a schematic block diagram the basic and usual structure of a storage chip with the associated peripheral units. See, for example, the article "Peripheral Circuits for One-Transistor Cell MOS RAM's", R. C. Foss et al, *IEEE Journal of Solid-State Circuits*, Vol. SC10, No. 5, October 1975, pp. 255-61. Reference 1 designates the storage array including a plurality of storage cells 2. Storage cells 2 are, as usual, provided in matrix form at the point of intersection of respective associated row and column lines. In FIG. 1, the row lines are marked word lines WL, and the column lines are bit lines BL. The selection of one or several cells is performed in a known manner through coincident row and column activation. From the binary-coded address information of address inputs 3 the row address is decoded in word line decoder 4, and the associated column address is decoded in bit line decoder 5. An organization including the address decoding on the storage chip is of considerable importance for utilizing a high degree of integration because it permits operation with a low number of external connections.

FIG. 1 shows as further supplementary circuits pre-amplifiers 6, precharging circuits 7, bit lines switches 8, buffer/amplifier 9 and data input/output circuit, bipolar sense amplifier/bit driver 10, in the data path. The basic structure described above is typical particularly for dynamic storage chips. Storage cell 2, pre-amplifier 6, and precharging circuit 7, to give an example, can be made in the manner known from the publication in the IBM Technical Disclosure Bulletin Vol. 18, No. 3, August 1975, pp. 786/787. The pre-amplifier 6 is designed as a gated flipflop responsive to clock pulse SL and serves to detect and amplify the very small differential signals appearing on bit line SBL after a read access cycle. By means of precharging circuit 7 controlled by a corresponding restore pulse RBL a predefined and balanced starting condition is provided on the column or bit lines for each storage access cycle. Bit line switches 8 controlled by bit line decoding signal BD establish for respective selected bit line pairs the connection to the data input/output circuit 10. A teaching of a typical data input/output circuit may be found in U.S. Pat. No. 3,676,704 of Donofrio et al, assigned to the assignee of the instant invention. Since typical MOS storage chips in a storage organization communicated with bipolar circuits that are superior with respect to their operational speed, the storage chip normally contains, if necessary the respective level converters and driver circuits (not shown) to provide and accept bipolar logic level digital signals. If the respective system is a more complicated one, the control of necessary timing signals for a storage access cycle is critical from a time point of view and therefore is usually included on the memory chip, preferably derived from one single pulse input (e.g. the chip select pulse).

Figure 2:
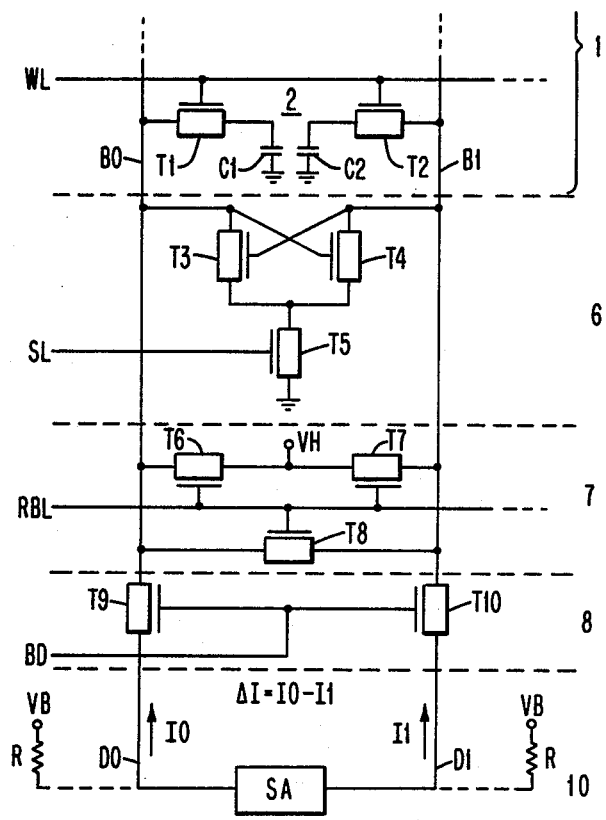
FIG. 2 is a more detailed circuit diagram of the access circuit connected to a bit line pair in accordance with an embodiment of the invention.

In order to access data stored in a memory as in FIG. 1 the information signal, in a manner typical for dynamic storages, is amplified in two steps before it reaches the output connections of the memory chip. A read-out process is initiated by the activation of a word line WL which causes the memory cell to generate a positive or negative differential voltage between the bit lines belonging to a bit line pair BL. The bit lines on both sides of bit line switches 8 are normally precharged to the same potential by means of precharge circuits, only one of which is shown. The polarity of the differential voltage on the two bit lines of a bit line pair depends on the charges stored on the storage capacitors, not shown. After the differential voltage has been fully developed the gated flipflop in preamplifier 6 is set by clock SL. Thus, in accordance with the stored binary information, the potential of one of the two bit lines is lowered, e.g. to ground. In the next step, the selected bit lines are connected via bit line switch 8 in response to clock BD to a buffer/amplifier 9 which is frequently provided jointly for several bit line pairs. If a sufficient differential voltage has formed at its inputs amplifier 9 is set by signal SB to provide an output signal to the sense amplifier/bit driver 10.

In this known concept at least four control signals (WL, SL, RBL, DB) are required for a storage access or read cycle. They are additionally highly critical with regard to their order of appearance. This is for instance shown by the fact that control pulse BD for this respective bit line switches 8 must only appear after the gated flipflop in preamplifier 6 has been set by the SL pulse. Otherwise, the result of the logic state of the information obtained in sensing by pre-amplifiers 8 could be wrongly interpreted due to undesirable loading provided by the connection of the bit lines to the circuitry including buffer/amplifier 9. The instant invention utilizes much of the the same basic structure of a storage chip as shown in FIG. 1 except that the control of bit line switches 8 is different. Thus, the operation is controlled much more simply and advantageously, and the access speed is higher; buffer/amplifier 9 in FIG. 1 is no longer required; the bit line sections which lead to the external circuits from the bit line switches, and which will be called data lines, can be directly coupled to a sensing circuit for detecting the differential data current. The last referred to circuit may be provided in bipolar technology on a chip separated from the storage chip.

FIG. 2 shows schematically the data access path for a single column of memory cells of the system of FIG. 1 in a more detailed representation for demonstrating the improvement as disclosed by the invention. Corresponding to the column line marked BL in FIG. 1 there now corresponds bit line pair B0, B1. By means of the numbered zones shown in interrupted lines along the column section, the association to the respective circuit elements in FIG. 1 may be facilitated. Between B0 and B1 in section 1 storage cells 2 are provided which are associated with bit line pair B0, B1. As an example of a storage cell, a so-called two-device storage cell is illustrated having storage capacitors C1 and C2 accessible via field effect transistors T1 and T2. Connected to the gate electrodes of T1 and T2 is the row selecting line, i.e. word line WL. Coupled to the bit line pair, in section 6, the pre-amplifier is provided. For that purpose a flipflop comprising transistors T3 and T4 is preferably used which can be enabled via transistor T5 which provides a common connection to ground potential. The associated set pulse is marked SL. In section 7, precharge potentials are provided for the bit lines by transistors T6, T7, and T8. T6 and T7 provide a quick charging of the respective bit line sections to almost the drain supply voltage VH. T8 provides a satisfactory balance of the bit line potentials. The associated signal for the bit line restore is marked RBL. The above described circuit arrangement and its function are equally known from the initially mentioned publication in the IBM Technical Disclosure Bulletin. N-channel field effect transistors of the enhancement type have been assumed for the embodiment involved.

Further along the column section of FIG. 2 are provided the bit line switches T9 and T10. By means of T9 and T10 bit lines B0 and B1 either can be isolated from the outward-leading data lines marked D0 and D1, or can be connected thereto during an access cycle. With respect to their gate electrodes, T9 and T10 are interconnected and are controlled by bit decoder signal BD. T9 and T10 are thus part of the column decoding system. Reference is made in that connection to the fact that several bit line pairs B0, and B1 may utilize a common pair of extending data lines D0, and D1, coupled to a common sense amplifier, as are generally provided. The bit line switches furthermore designate the chip boundary of the memory chip.

Figure 3:
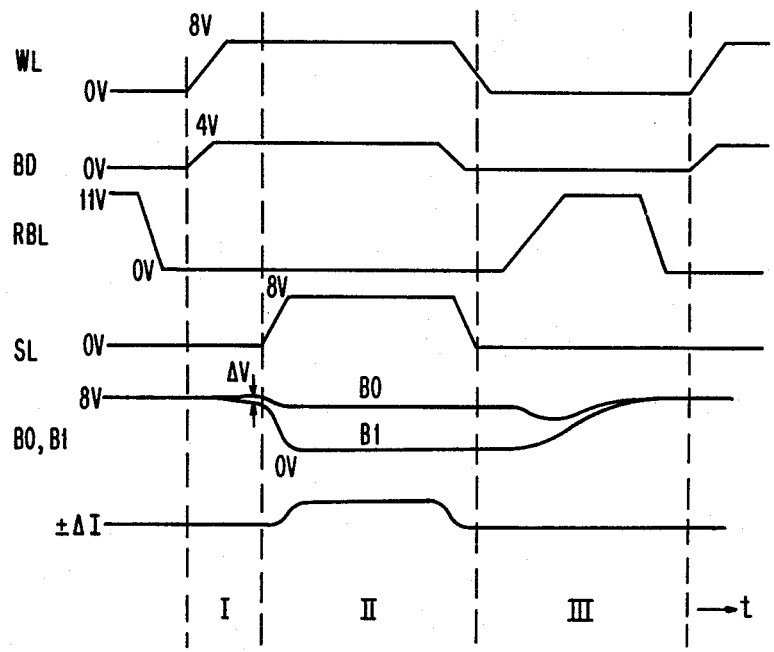
FIG. 3 is a pulse diagram illustrating the relationship between various control pulses as disclosed by the invention.

Referring to FIG. 3 the improved operation and its control as taught by the instant invention will now be described in more detail. First, a read-out process will be discussed where reduction of the access time is naturally of specific inprotance. It is assumed that the bit lines have been precharged and balanced in a preceding phase or access cycle, to the required starting potentials; reference thereto will be made below. A read-out process is initiated by means of the activation of a word line (WL pulse). Within the scope of the invention, the BD pulse may appear simultaneously wiith the WL pulse, and bias a pair of bit line switches T9, T10 to the effect of a pre-conditioning. The BD pulse has an intermediate potential which preferably equals the potential VB of the data lines D0 and D1 also precharged in the preceding phase, as indicated by the effective resistors R. The threshold values of the FET's have of couse to be considered in the usual way. If a supply voltage 8 of 8 volts is assumed, about 4 volts are advantageous for the intermediate potential for BD and the precharge potential of D0, D1. In the first time period marked I in FIG. 3 a differential voltage depending on the charge stored on C1 and C2 can develop in a known manner on bit lines B0 and B1 via T1 and T2 which are conductive due to the WL pulse. This very low differential voltage which originates from the charge distribution between the storage and bit line capacitances and is shown towards the end of time interval I, and it is marked $\Delta V$. It will be recognized by those skilled in the art that the two-device cell of the instant invention provides a simpler technique for developing the desired differential signal with less signal disturbing noise than that available from a single-device cell and a dummy or reference cell as found in the prior art.

After the generation of differential voltage $\Delta V$ the latching circuit in the form of the gated flipflop with transistors T3, T4, and T5 is set in the subsequent phase II. This phase is consequently characterized by the appearance of set pulse SL whereby, depending on the sign of differential voltage $\Delta V$, either B0 or B1 is lowered to ground potential. The setting of the flipflop provides amplification and fixed latching of the extremely low differential signal which was originally coupled to the bit line pair by the storage cell. For the case of FIG. 3 it had been assumed that bit line B1 which previously had been precharged to a starting potential of 8 volts, is discharged to ground potential whereas the potential of B0 remains approximately unchanged. Due to inavoidable leakage currents from the storge capacitors, as well as due to the transition phase of the flipflop, the potential values actually achieved will be between 0 and 1 Volt for B1 and between 7 and 8 Volts for B0. The initial charge storage state of storage capacitors C1 and C2 is determined from the resulting bit line potentials. This result indicates that C1 had been substantially charged (to VH, e.g. 8 Volts), and that C2 had been substantially discharged. Thus, the pre-amplifying flipflop has been pre-conditioned in such a manner that, with the appearance of the SL pulse, bit line B1 has been fully discharged via conductive transistors T4 and T5.

Transistors T9 and T10 remain non-conductive during phase I due to the intermediate biasing of the BD pulse, with B0 and B1 being precharged to VH, i.e., 8 Volts. If the potential of bit line B0 or B1 falls during phase II below voltage $BD - VT$, where VT equals the threshold voltage of T9 and T10, a current begins to flow in one of the two transistors T9 or T10 via T3 or T4 and the common transistor T5. D0 or D1 will begin to fall toward ground. Whether T9 or T10 becomes conductive will be determined solely by the information stored on C1 and C2, since the differential voltage developing on B0 and B1 is determined by said information. For the given example, i.e. that B1 is discharged to almost ground potential, T10 will therefore be conductive as soon as its gate potential (BD pulse) is higher by the threshold voltage of T10 than the decreasing B1 potential. Bit line B1 can in that case be considered the source supply, and data line D1 as the drain supply for T10. In a writing process which will be described below, this association will be reversed. Finally, in phase II there flows a current $I_1$ or $I_0$, i.e. a differential current, as a function of the storage information, and it can be sensed in the usual manner. A second amplifier stage is no longer required under the present conditions, contrary to the structure shown in FIG. 1.

That the respective other one of the two bit line transistors T9, T10 remains securely non-conductive is evident from the selection of the quiescent or precharge voltages on B0 and B1 (to VH) and the lower intermediate potential of approximately VH/2 for the BD selection pulse. The quiescent potential of data lines D0, D1 should not be lower than the BD potential less one threshold voltage drop because otherwise T9 and T10 may not remain non-conductive during phase I. The quiescent potential of data lines D0, D1 should preferably be slightly lower than the potential of the bit line sections over bit line switches T9 and T10. By this means it is ensured that during phase I the bit line switches remain securely non-conductive, even if in the presence of the small differential voltage ΔV there should appear unavoidable potential variations of the bit line B0 connected to the precharged storage capacitor due to leakage of the stored potential.

The above described access cycle is terminated toward the end of phase II in that first BD, then WL, and finally SL are again reduced to their starting potentials, i.e. at first bit lines B0 and B1 are isolated from data lines D0 and D1. The pre-amplifying flipflop securely maintains the full differential voltage, and thus the storage information, during this period by keeping B1 at ground potential and B0 at VH, approximately. Since the storge cell transistors T1 and T2 are still held conductive by the WL pulse, the information stored in the flipflop is thus correctly "re-written" into storage capacitors C1 and C2. With the reduction of the WL pulse the storage charge on C1 or C2 is separated or isolated from the bit lines. Subsequently, the flipflop setting pulse SL can be removed.

After any such storage access there follows the recharging of the access lines as shown in FIG. 3 in phase III. This is shown in FIG. 3 for bit lines B0 and B1 as they converge at 8V. In this phase there appears the restore clock RBL. For RBL a control potential higher than VH is preferably selected, e.g. 11 Volts. This is to ensure a line precharge of maximum speed via T6 and T7 to the full voltage VH and an optimum potential equalization via T8, without the threshold voltage of the respective transistors having any influence thereon. Such control signals of excessive potential can be generated in a known manner by means of so-called Bootstrap circuits.

In a writing-in process, simultaneously with the activation of word line WL the potential of one of data lines D0 or D1 is reduced, preferably to ground potential. The differential voltage forming on the bit lines due to the existing storage charge in the capactors C1 and C2 can thus be overwritten. The relative source-drain relationship of the terminals of bit switch transistors T9, T10 are reversed relative to a read-out process. An important advantage of the operational selection signal sequence as disclosed by the invention is that it is the same for the read-out and the write-in process. Compared with known circuit concepts of this type in which four control signals are needed which are highly critical with respect to time, in the instant invention, critical demands are made on only two control pulses, i.e. the WL and the SL pulse. The above mentioned considerable improvements can thus be achieved to provide a shorter storage access time.

Finally, the invention compared with the prior art of FIG. 1 will be explained in a very generalized form by means of FIGS. 4A and 4B. In the known circuit arrangements for storage access, the bit line switches are controlled via decoding pulse BD in such a manner that both switches are in the same state. That is, both bit lines B0 and B1 are either isolated from data lines D0 and D1, or connected thereto. The bit line whose potential has not been reduced can thus be disturbed from outside, and the sensitive read signal can be affected. For that reason, a second amplifier stage has generally been provided before the storage signal can be read from the associated storage chip. This case is demonstrated in FIG. 4A by the rigid coupling of the switching elements. Compared therewith and in accordance with the invention, the BD pulse merely applies to the bit line switches an intermediate precharge, described in detail above, to preset them without rendering them conductive. This precharge is selected in such a manner that due to the differential voltage appearing on the bit lines only one of the two bit line switches becomes conductive and connects only the respective bit line having its potential reduced to the associated data line. The other bit line remains isolated from its associated data line. The final condition of the switches is thus derived from the respective bit line potential, as indicated by the arrows in FIG. 4B.

Although the invention has been described in terms of a single embodiment thereof, it will be understood by those skilled in the art that various charges in form and details may be made therein without departing from the spirit and scope of the invention.

What is claimed is:

1. A read/write circuit for a dynamic field effect transistor memory system including a matrix of dynamic storage cells, each storage cell having a capacitive storage node capable of being coupled to a column line in response to an addressable row selection means, a plurality of pre-amplifiers connected to said column lines for detecting and amplifying signals coupled to said column lines by said row selection means and at least one input/output terminal capable of being coupled to at least some of said column lines by the current conducting terminals of a field effect transistor switching means, the improvement comprising:
   column line precharging means for precharging said column lines to a predetermined first reference potential corresponding to a first stored logic state;
   input/output terminal precharging means for precharging said input/output terminal to a second predetermined reference potential having a magnitude less than said first reference potential by more than one field-effect transistor threshold voltage drop and greater than a potential corresponding to a second logic state; and
   addressable column selection means coupled to the gate electrode of said switching means for selectively applying a third reference potential to at least one of said switching means, said third reference potential having a magnitude not greater than one field effect threshold voltage drop above said second reference potential, whereby said field-effect transistor switching means will become conductive when the potential of a data signal to be coupled between a selected on of said column lines and said input/output terminal has a magnitude of less than one field-effect transistor threshold drop below said third reference potential.

2. The circuit of claim 1 wherein said second and third reference potential are equal.

3. The circuit of claim 1 wherein said third reference potential equals approximately one-half the first reference potential.

4. The circuit of claim 1 wherein said preamplifiers are responsive to a set pulse which enables said preamplifiers only after said data storage nodes are coupled to said column lines.

5. The circuit of claim 1 wherein said memory system includes pairs of column lines connected to a differential preamplifier and said field effect transistor switching means comprises a pair of field-effect transistors having their respective current conducting terminals connected to at least one of said pair of column lines and wherein only a single one of said pair of field effect transistors becomes conductive in response to an applied data signal.

6. The circuit of claim 5 wherein said dynamic storage cell comprises a two-device field effect transistor memory cell having a pair of complementary data-storing capacitive storage nodes capable of being coupled to one of said pairs of column lines.

7. The circuit of claim 6 further including a differential current sensing means coupled to said input/output terminals.

8. The circuit of claim 1 wherein said storage nodes are coupled to said column lines simultaneously with the application of said third reference potential to said switching means.